(12) United States Patent
Nishimura et al.

(10) Patent No.: US 6,332,835 B1
(45) Date of Patent: Dec. 25, 2001

(54) POLISHING APPARATUS WITH TRANSFER ARM FOR MOVING POLISHED OBJECT WITHOUT DRYING IT

(75) Inventors: Matsuomi Nishimura, Omiya; Mikichi Ban, Haga-machi; Kazuo Takahashi, Kawasaki; Osamu Ikeda, Yokohama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/193,858

(22) Filed: Nov. 18, 1998

(30) Foreign Application Priority Data

Nov. 20, 1997 (JP) .................................................... 9-319844

(51) Int. Cl.⁷ ...................................................... B24B 7/00
(52) U.S. Cl. ............................ 451/67; 451/339; 451/456
(58) Field of Search .................................. 451/41, 53, 54, 451/66, 67, 285, 286, 287, 288, 289, 290, 339, 449, 450, 451, 456

(56) References Cited

U.S. PATENT DOCUMENTS

| | | | |
|---|---|---|---|
| 5,233,224 | 8/1993 | Ikeda et al. | 257/773 |
| 5,239,410 | 8/1993 | Nishimura et al. | 359/344 |
| 5,404,046 | 4/1995 | Matsumoto et al. | 257/750 |
| 5,466,961 | 11/1995 | Kikuchi et al. | 257/379 |
| 5,488,507 | 1/1996 | Nishimura | 359/344 |
| 5,550,393 | 8/1996 | Nishimura | 257/192 |
| 5,598,037 | 1/1997 | Kikuchi et al. | 257/773 |
| 5,614,439 | 3/1997 | Murooka et al. | 437/194 |
| 5,653,623 | * 8/1997 | Kimura et al. | 451/72 |
| 5,655,954 | * 8/1997 | Oishi et al. | 451/67 |
| 5,658,183 | * 8/1997 | Sandhu et al. | 451/5 |
| 5,679,059 | * 10/1997 | Nishi et al. | 451/41 |
| 5,755,614 | * 5/1998 | Adam et al. | 451/60 |
| 5,888,124 | * 3/1999 | Lin et al. | 451/67 |
| 5,904,611 | 5/1999 | Takahashi et al. | 451/41 |
| 5,931,723 | * 8/1999 | Katsuoka et al. | 451/285 |
| 5,933,204 | 8/1999 | Fukumoto | 349/43 |
| 6,012,966 | 1/2000 | Ban et al. | 451/8 |
| 6,050,884 | * 4/2000 | Togawa et al. | 451/67 |

\* cited by examiner

*Primary Examiner*—Timothy V. Eley
(74) *Attorney, Agent, or Firm*—Fitzpatrick, Cella, Harper & Scinto

(57) ABSTRACT

A polishing apparatus that can effectively and efficiently remove potassium and other alkaline metals comprises integrally a polishing unit for polishing an object by means of a polishing agent and a cleaning unit for cleaning the polished object. The polishing unit and the cleaning unit have means for isolating the internal atmosphere from the external atmosphere and the cleaning unit has a means for cleaning the polished object by bringing hot pure water or steam of pure water into contact with the polished object. With a cleaning method hot pure water is brought into contact with the polished object without drying it after having been polished by such a polishing apparatus.

9 Claims, 12 Drawing Sheets

REACTION ON CATION EXCHANGE RESIN:

• $R-SO_3H + NaOH \rightarrow R-SO_3Na + H_2O$  (NEUTRALIZATION)

EXPECTED REACTION:

• $X-SiO_3H + KOH \rightarrow R-SiO_3K + H_2O$

POLISHING APPARATUS WITH TRANSFER ARM FOR MOVING POLISHED OBJECT WITHOUT DRYING IT

BACKGROUND OF THE INVENTION

1. Field of the Invention

This invention relates to a polishing apparatus to be suitably used for the process of preparing a wiring section of a semiconductor device such as a semiconductor memory, which may be a DRAM, or a microprocessor and that of an electrooptical device such as a liquid crystal device or a plasma display device. It also relates to a polishing/cleaning method to be used with such an apparatus as well as to a method of preparing a wiring section.

2. Related Background Art

Firstly a known process of preparing a wiring section of a semiconductor device will be described.

The technique of CMP (chemical mechanical polishing) has been widely used in recent years in the process of manufacturing semiconductor devices and electrooptical devices in order to alleviate the problem of the depth of focus that can arise in the exposure step of photolithgraphy and improve the step coverage of the coat of the device.

FIGS. 14A through 14D of the accompanying drawings are schematic cross sectional side views of a semiconductor device, illustrating different manufacturing steps.

A silicon oxide film 102 is formed by plasma CVD on a semiconductor wafer 100 carrying thereon lower wires 101 that are made of polycrystalline silicon or silicide and operate as components such as gate electrode. The surface of the produced silicon oxide film may show projections and recesses due to the underlying wires 101 (Step PAS1, FIG. 14A).

Then, the surface of the silicon oxide film is polished by means of a polyurethane polishing pad and a polishing agent prepared by dispersing fine silicon oxide particles in an aqueous solution of KOH until the surface becomes flat (Step PAS2, FIG. 14B).

Subsequently, the work is cleaned by means of an acidic or alkaline chemical agent and a brush. Then, photoresist is applied to the surface of the flattened and smoothed silicon oxide film and expose the photoresist to a beam of KrF excimer laser to produce a latent image of the pattern for forming a contact hole. Thereafter, the latent image is developed to produce a photoresist pattern. The work is then subjected to RIE (reactive ion etching) by using the patterned photoresist as mask to produce a contact hole 103 (Step PAS3, FIG. 14C).

Thereafter, the photoresist is removed and a silicon-containing aluminum film 105 is formed in the contact hole and on the silicon oxide film (Step PAS4, FIG. 14D).

A multi-wire arrangement can be obtained by repeating the above process.

However, it has recently been found that some of the substances that have adhered to the semiconductor device during the manufacturing process cannot be removed by the above described cleaning method.

For example, a polishing agent obtained by dispersing fine particles of silicon oxide in a potassium-containing treatment agent such as an aqueous solution of potassium hydroxide (KOH) may be used in the above described CMP process. However, the potassium (K) that have adhered to the interlayer insulation film to be polished out of the polishing solution cannot be removed by a chemical cleaning solution of aqueous hydrogen peroxide containing sulfuric acid or ammonium. Nor was it possible to remove it by means of a brush.

SUMMARY OF THE INVENTION

Therefore, it is an object of the present invention to provide a polishing apparatus and a polishing method that can effectively and efficiently remove potassium and other alkali metals and also a method of preparing a wiring section.

Another object of the present invention is to provide a polishing apparatus and a polishing method that can remove potassium and other alkali metals without using a high concentration chemical agent typically containing sulfuric acid and also a method of preparing a wiring section.

According to the invention, the above objects and other objects are achieved by providing a polishing apparatus comprising integrally a polishing unit for polishing an object by means of a polishing agent and a cleaning unit for cleaning the polished object, wherein:

the polishing unit and the cleaning unit have means for isolating the internal atmosphere from the external atmosphere; and the cleaning unit has means for cleaning the polished object by bringing hot pure water or steam of pure water into contact with the polished object.

The cleaning unit may additionally have means for drying the polished object after cleaning it with hot pure water.

The polishing unit and the cleaning unit may be provided with an exhaust port and have means for maintaining the internal atmosphere under negative pressure relative to the external atmosphere.

A potassium-containing polishing agent may be used for polishing the object in the polishing unit.

The cleaning means of the cleaning unit may have a heating means adapted to heat pure water to or above 80° C.

The cleaning unit may have means for applying ultrasonic waves with a frequency between 0.8 MHz and 10 MHz to the hot pure water used by the cleaning means.

The hot pure water may contain ozone.

The cleaning unit may have a cleaning member adapted to be brought into contact with the polished object to physically remove any foreign objects adhering to it.

According to the invention, there is also provided a method of polishing/cleaning an object using a polishing apparatus comprising integrally a polishing unit for polishing an object by means of a polishing agent and a cleaning unit for cleaning the polished object, comprising steps of:

polishing the object with the polishing agent; and cleaning the polished object by bringing hot pure water into contact with it without drying it after polishing it with the polishing agent.

The cleaning method may use a potassium-containing polishing agent.

The polished object to be cleaned by the cleaning method may have a plasma-treated surface.

The hot pure water to be used with the cleaning method may be heated to or above 80° C. before brought into contact with the polished object.

Ultrasonic waves with a frequency between 0.8 MHz and 10 MHz may be applied to the hot pure water to be used with the cleaning method.

The polished object to be cleaned by the cleaning method may be a substrate for preparing an electronic device having a wiring section being formed.

The polishing/cleaning method according to the invention may further comprise subsequent to cleaning the polished object:

a first cleaning step of cleaning the object by using ozone-containing ultra-pure water outside said polishing apparatus;

a second cleaning step of cleaning the object by using a solution containing hydrofluoric acid, hydrogen peroxide and a surface active agent and applying ultrasonic waves with a frequency of above 100 KHz;

a third cleaning step of cleaning the object by using ozone-containing ultra-pure water and applying ultrasonic waves of above 100 KHz;

a fourth cleaning step of cleaning the object by using a solution containing hydrofluoric acid; and a fifth cleaning step of cleaning the object by using ultra-pure water and ultrasonic waves with a frequency of above 100 KHz.

According to the invention, there is also provided a method of making a wired section comprising steps of forming an insulation film, flattening the insulation film, forming a hole in the insulation film, filling an electroconductive material into the hole and forming an electroconductive film on the insulation film, characterized in that:

the step of forming an insulation film includes a step of depositing an insulator by means of a plasma processing technique or a CVD technique; and the flattening step includes a polishing step using a potassium-containing polishing agent and a cleaning step of bringing hot pure water or steam of pure water into contact with the polished surface of the object without drying the polished surface.

According to the invention, there is also provided a method of making a wired section comprising steps of forming an insulation film, forming a groove in the insulation film, forming an electroconductor at least in the groove and removing part of the electroconductor, characterized in that:

the step of forming an insulation film includes a step of forming an insulator by means of a plasma processing technique or a CVD technique; and the removing step includes a polishing step using a potassium-containing polishing agent and a cleaning step of bringing hot pure water or steam of pure water into contact with the polished surface of the object without drying the polished surface.

According to the invention, there is also provided method of making a wired section comprising steps of:

forming an insulation film on a substrate by means of a plasma processing technique or a CVD technique;

polishing the insulation film or an electroconductor formed on the insulation film or in a groove of the insulation film by using a polishing agent; and cleaning the polished surface of the insulation film by bringing hot pure water or steam of pure water into contact with the polished surface without drying the surface.

The hot pure water may be supplied from the outside of said polishing apparatus.

The hot pure water may be supplied by way of the piping system of the plant where said polishing apparatus is arranged.

DESCRIPTION OF THE PREFERRED EMBODIMENTS

Now, the present invention will be described by referring to the accompanying drawings that illustrate preferred embodiments of the invention.

Figures 1, 3:
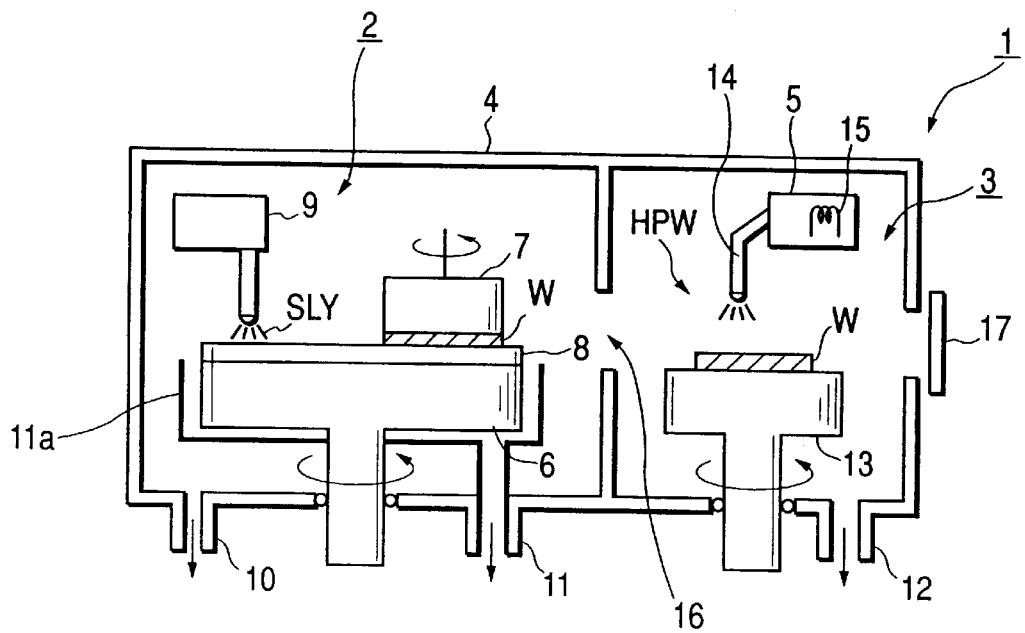
FIG. 1 is a schematic illustration of an embodiment of polishing apparatus according to the invention.
FIG. 3 is a chart illustrating ion exchange reactions.

FIG. 1 is a schematic illustration of an embodiment of polishing apparatus according to the invention. The polishing apparatus 1 integrally comprises a polishing unit 2 for polishing an object of polish W by using a polishing agent SLY and a cleaning unit 3 for cleaning an object of polish W that has been polished. The polishing unit 2 and the cleaning unit 3 are provided with an isolation means 4, which is typically partition walls or separator, for isolating the wet and less clean internal atmosphere from the dry and cleaner external atmosphere. The cleaning unit 3 has a feature of being provided with a cleaning means 5 for cleaning an object of polish W by bringing hot pure water HPW into contact with the object.

Reference numeral 6 denotes a polishing platen that revolves, holding a polishing pad 8 typically made of polyurethane or unwoven fabric and reference numeral 7 denotes a holder that also revolves, holding an object of polish W, which is typically a semiconductor wafer, whereas reference numeral 9 denotes a polishing agent supply means having a nozzle for feeding the polishing agent SLY onto the polishing pad 8. The inside of the polishing unit 2 is isolated from the external atmosphere by partition walls 4 and air is drawn out of it through an exhaust port 10 to keep the inside under slightly negative pressure relative to the atmosphere. Reference numeral 11 denotes a waste polishing agent delivery port held in communication with a waste polishing agent receiver 11a.

Reference numeral 12 denotes a waste cleansing water delivery port and reference numeral 13 denotes a holder that revolves, holding a wafer W that has been polished. Cleansing water is heated by the cleaning means 5 having a heat generating member 15 operating as a heater before being supplied. Waste cleansing water is collected through the waste cleansing water delivery port 12. The inside of the cleaning unit 3 is also isolated from the external atmosphere by partition walls 4 and kept under slightly negative pressure relative to the atmosphere as air is drawn out of it through opening 16 and the exhaust port 10 of the polishing unit 2. Reference numeral 17 denotes a shutter arranged at a gateway through which wafers W can be moved into the apparatus from the clean room surrounding the apparatus and then back to the clean room. Within the apparatus 1, wafers are moved by means of a wafer transfer arm (not shown).

The apparatus operates for polishing a wafer W in a manner as described below. The wafer W to be polished is placed near the gateway and then the shutter 17 is opened. The transfer arm (not shown) moves the wafer W into the polishing unit 2 of the apparatus 1 and puts it under the holder 7 with the surface to be polished facing downward. The platen 6 having a polishing pad 8 fitted thereto is driven to revolve at a rate of 10 to 100 rpm and a polishing agent prepared by dispersing fine silicon oxide particles into an aqueous solution containing alkali metal such as K (potassium) is fed to it by the supply means 9. The holder 7 adapted to revolve is moved downward until the polishing pad is pressed against the surface of the wafer W to be polished. Since the platen is already revolving at this stage, the wafer is polished by fine polishing particles captured by micropores of the polishing pad. When a predetermined period of time has passed as timed by the actual polishing operation or by detecting the driving torque of the platen, the holder 7 is raised to separate the wafer W and the pad 8 to terminate the polishing operation.

Now, a cleaning method according to the present invention will be described by also referring to FIG. 1.

In a mode of carrying out a polishing/cleaning method according to the invention, the object of polish W is polished by using a polishing agent SLY in a manner as described above and then cleansed by bringing hot pure water HPW into contact with the object of polish W that is still wet with the polishing agent.

The polished wafer is taken out of the holder 7 by means of an arm (not shown) and turned upside down and placed on the holder 13 before it is moved into the cleaning unit 3 through the opening 16 in a wet atmosphere. The holder 13 revolves, rigidly holding the wet wafer W. At this stage, cleansing water heated to or above 80° C. by the electrically energized heat generating member 15 is sprayed onto the polished surface of the wafer through the nozzle 14 to remove the K (potassium) adhering to or adsorbed by the polished surface. The wafer can be cleansed by hot pure water without drying it because the internal atmosphere is isolated from the relatively dry external atmosphere by the isolation means of the apparatus of FIG. 1 that integrally comprises the polishing unit and the cleaning unit.

The effect of removing K (potassium) of the apparatus by means of hot pure water will be discussed below.

Figure 2:
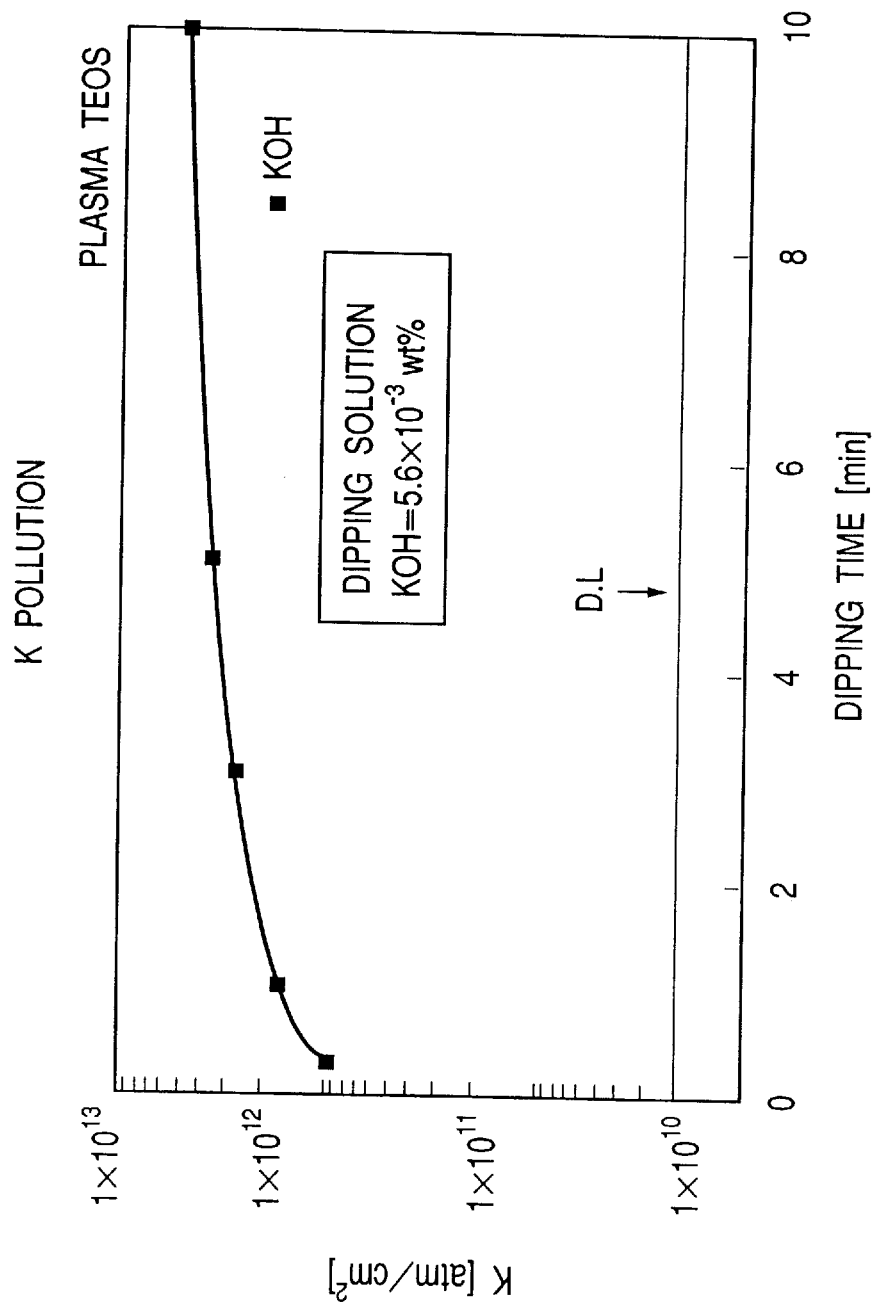
FIG. 2 is a graph showing the relationship between the time of dipping into a potassium-containing solution and the extent of potassium adhesion.

Adhesion of Potassium to the Object of Polish as a Result of Using a Potassium-containing Polishing Agent FIG. 2 is a graph showing the relationship between the time of dipping into a potassium-containing solution and the extent of potassium adhesion obtained as a result of an experiment.

In the experiment, a specimen was prepared by coating a silicon wafer with a non-doped silicon oxide film by plasma CVD using tetraethoxysilane (TEOS) which is an organic compound of silicon. Meanwhile, an aqueous solution containing KOH by $5.6 \times 10^{-3}$ wt % was prepared. Then, the specimen was dipped into the aqueous solution and the extent of potassium adhesion was observed over a certain period of time. FIG. 2 shows the obtained result.

It will be seen that, the instant the specimen was dipped into the aqueous solution, potassium was adsorbed by the specimens at a rate of $1 \times 10^{12}$ atm/cm$^2$ and the rate of adsorption increased gradually until a saturation level between $10^{12}$ and $10^{13}$ atm/cm$^2$ was reached.

On the other hand, K-containing aqueous solutions with KOH concentrations of 56 ppm, 560 ppm, 5600 ppm and 5% were prepared and similar experiments were conducted by using identical specimens to find that the extent of potassium adhesion was somewhere around $10^{12}$ atm/cm$^2$ for all the aqueous solutions.

In another experiment, a specimen of silicon wafer (bare wafer) and another specimen of silicon wafer having a thermally oxidized surface were prepared and dipped respectively into the same K-containing aqueous solutions to find no potassium adhesion after 10 minutes.

Now, let us look into potassium adhesion and the chemical reaction that takes place as a result of potassium adhesion. Take, for example, the reaction of cation exchange resin. It essentially consists in neutralization as shown in FIG. 3. Assume now that silicon oxide does not satisfy the stoichiometric atomic ratio. Then, potassium will presumably adhere to nonstoichiometric silicon oxide by way of the reactions shown in FIG. 3.

Potassium Removal by Cleansing with Hot Water

Now, a technique of removing the potassium adhering to an object will be described.

Figure 4:
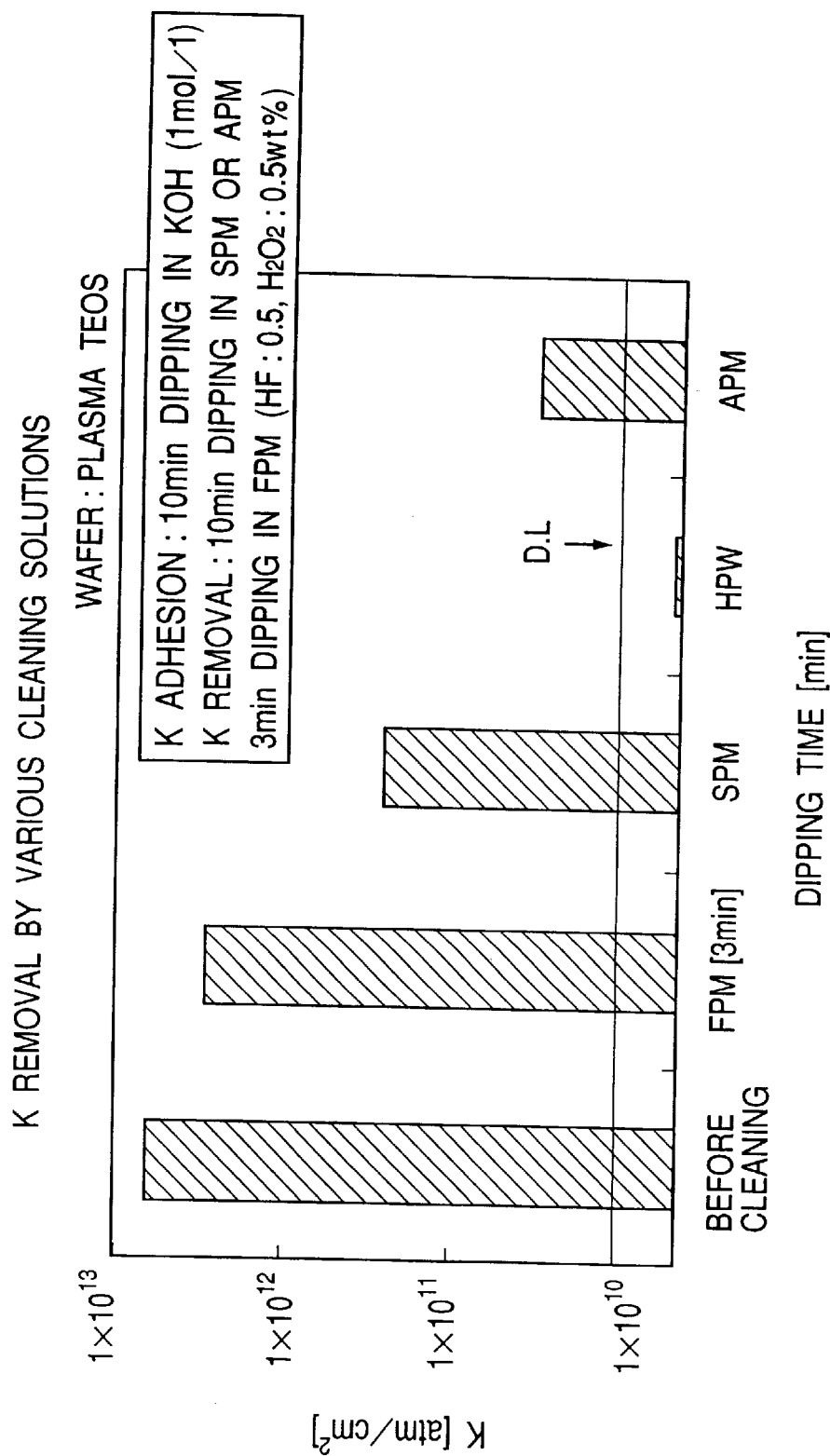
FIG. 4 is a graph showing the cleaning effect of various cleaning solutions on adherent potassium.

FIG. 4 is a graph showing the cleaning effect on adhering potassium of various cleaning solutions. In an experiment, four different cleaning solutions were prepared; an 80° C. aqueous solution containing HF by 0.5 wt % and hydrogen peroxide by 0.5 wt % (FPM), an 80° C. aqueous solution containing sulfuric acid and hydrogen peroxide (SPM), 80° C. ultrapure water (HPW) and an 80° C. aqueous solution containing ammonia and hydrogen peroxide (APM). Additionally, specimens of silicon wafers carrying silicon oxide film prepared by plasma CVD were dipped into a 1.0 mol/liter KOH aqueous solution for 10 minutes. The specimens were observed for the extent of potassium adhesion before cleaning and then dipped into the respective cleaning solutions for 10 minutes (3 minutes only for the FPM). FIG. 4 is a graph showing the cleaning effect on adhering potassium of each of the cleaning solutions. It will be seen that only the HPW could remove potassium to an extent below the detectable limit (DL).

Figure 5:
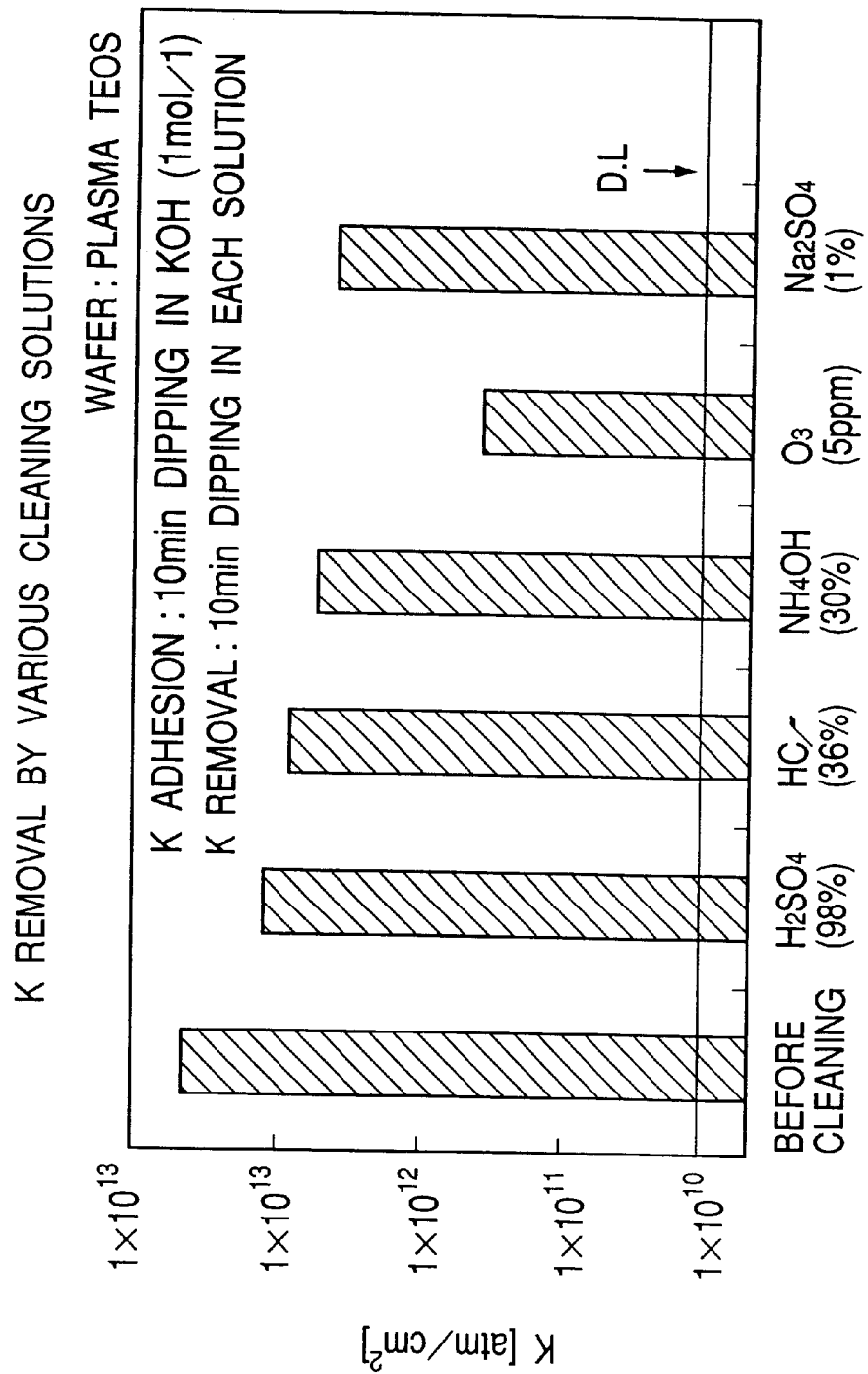
FIG. 5 is a graph showing the cleaning effect of various cleaning solutions selected for comparison on potassium adhering to an object.

FIG. 5 is a graph showing the cleaning effect on adhering potassium of different cleaning solutions selected for the purpose of comparison. As in the case of the above described experiment, specimens of silicon wafers carrying silicon oxide film were prepared by plasma CVD. The solutions were sulfuric acid, hydrochloric acid, aqueous ammonia, ozone-containing water and an aqueous solution of sodium sulfate. All the solutions were held to room temperature. As seen from FIG. 5, any of the cleaning solutions could not satisfactorily remove potassium.

Figure 6:
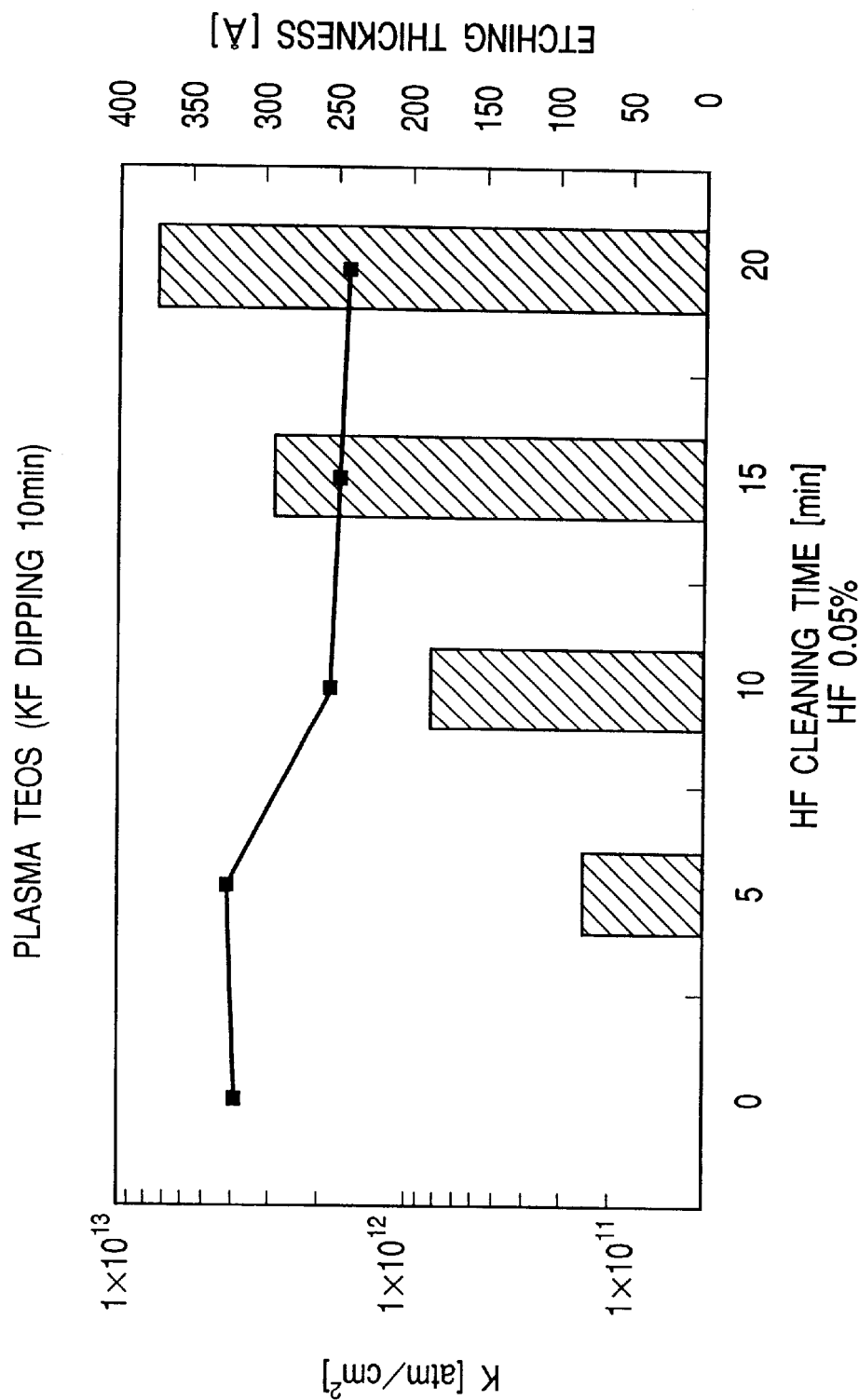
FIG. 6 is a graph showing the cleaning effect of an HF cleaning solution selected also for comparison on potassium adhering to an object and the etching thickness.

FIG. 6 is a graph showing the cleaning effect on adhering potassium and the etching thickness of an HF cleaning solution obtained in an experiment where specimens of silicon wafers carrying silicon oxide film prepared by plasma CVD were dipped into a potassium-containing solution for 10 minutes and then into a 0.05% HF aqueous solution for cleaning. As the duration of dipping into the HF solution increased, the etching thickness (bar graph) was also increased until the potassium-carrying silicon oxide film was almost etched out but the extent of potassium adhesion (line graph) did not show any significant reduction throughout the experiment. This indicates that the potassium adhering to a silicon wafer cannot be removed by means of any etching technique that may be defined as a cleaning technique in a broad sense of the words.

Figure 7:
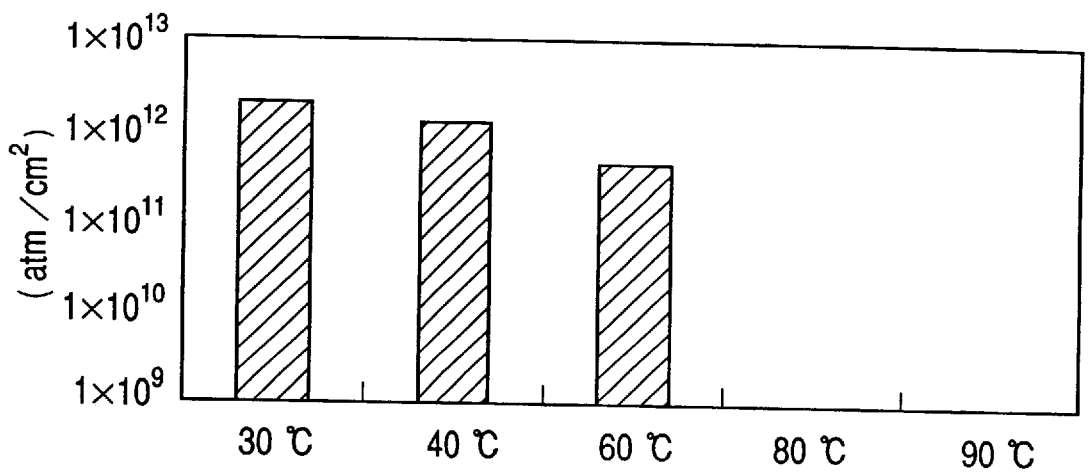
FIG. 7 is a graph showing the cleaning effect of the temperature of pure water used for cleaning on potassium adhering to an object.

FIG. 7 shows a bar graph illustrating the cleaning effect on adhering potassium of the temperature of pure water used for cleaning. Specimens of silicon wafers carrying silicon oxide film prepared by plasma CVD were dipped into a 1.0 mol/liter KOH aqueous solution for 10 minutes. Meanwhile, ultrapure water was put in five different vessels, which were heated to 30° C., 40° C., 60° C., 80° C. and 90° C. respectively. After dipping the specimens into the five different vessels of ultrapure water respectively, it was found that the extent of potassium adhesion fell to below $10^9$ atm/cm$^2$ only in the two vessels ultrapure water heated to 80° C. and 90° C. respectively. Although not shown in FIG. 7, the extent of potassium adhesion does not fall below $10^9$ atm/cm$^2$ when the temperature of ultrapure water is 70° C.

On the basis of the experiments described above by referring to FIGS. 2 through 7, it can safely be concluded that the use of pure water heated to above 80° C. is desirable for removing the potassium adhering to an object. For the purpose of the invention, the potassium adhering to a polished object can be removed by bringing hot pure water heated to temperature between 80° C. and 99° C., preferably between 80° C. and 95° C., into direct contact with the object by means of an apparatus as shown in FIG. 1.

Additionally, ultrasonic waves with a frequency between 0.8 MHz and 10 MHz may be applied to the hot pure water heated to the above temperature level. Still additionally, hot pure water may be made to contain ozone. While cleansing water is supplied to a revolving, polished object in the above description, the latter may alternatively be dipped into a vessel containing hot pure water. The polished surface of the object may be physically cleaned by means of a brush or a mass of a porous substance, while feeding hot pure water to the object.

Objects of Polish

Objects apt to be adhered by potassium includes compound insulators formed by deposition by means of plasma CVD at temperature below 800° C. and, if necessary, heat treated at temperature between 100° C. and 450° C. and those formed by deposition by means of sputtering and, if necessary, heat treated. Oxide insulators formed by a plasma treatment of exposing the substrate surface to oxygen plasma and, if necessary, heat treated are also apt to be adhered by potassium. Even insulators carrying silicon oxide film produced by thermal oxidation are apt to be adhered by potassium if the surface is at least partly subjected to a subsequent plasma treatment such as plasma etching. Such insulators are absolutely required to be polished if they are to be used as interlayer insulation film in a multilayer wired section. Specific insulators include noncrystalline compounds such as silicon oxide, silicon nitride, or silicon nitride oxide, which may be, if necessary, doped with boron, phosphor or fluorine. The compound film layer formed by any of the above plasma treatment techniques mostly contains a noncrystalline compound having a nonstoichiometric atomic ratio that is not compatible with the stoichiometric atomic ratio. Film formed by deposition by means of thermal CVD or photo-excited CVD is also apt to adsorb potassium.

Substrates to be suitably used for forming any of the above compound insulators include monocrystal semiconductor wafers such as Si, Ge, GaAs and InP wafers, quartz substrates and glass substrates.

A preferable polishing agent to be used for the purpose of the invention contains particles of silica ($SiO_2$), alumina ($Al_2O_3$) and/or cerium oxide (CeO) having a primary particle diameter between about 1 and 300 nm and a secondary particle diameter between about 3 and 1,000 nm and dispersed in a dispersant, which is preferably an aqueous solution that contains potassium typically in the form of KOH, $K_3Fe(CN)_6$ or potassium acetate.

Figure 8:
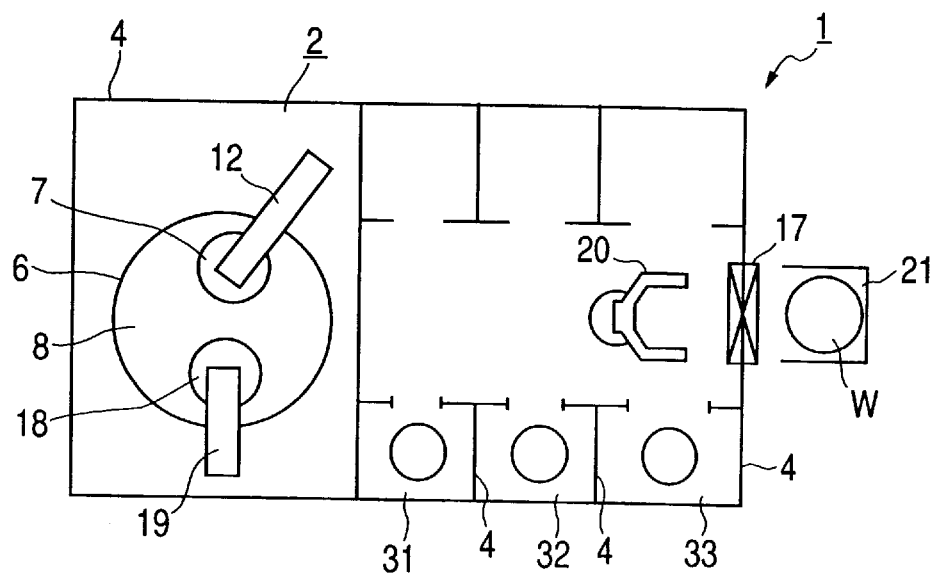
FIG. 8 is a schematic illustration of another embodiment of polishing apparatus according to the invention.

FIG. 8 is a schematic illustration of another embodiment of polishing apparatus according to the invention.

The embodiment of polishing apparatus comprises a pair of cleaning chamber 31, 32 and a drying chamber 33.

A wafer W placed in a cassette 21 that is located near the gateway is moved into the polishing apparatus isolated by partition walls 4 by means of a movable arm 20. As the arm 20 moves, the wafer W is fitted to the lower surface of the holder 7 and polished as in the case of the embodiment of FIG. 1. This embodiment is provided with a polishing capacity recovering member 1B for dressing or conditioning the polishing pad 8 and a support arm 19 for supporting the member 18 so that the pad 8 is dressed or conditioned as the wafer W is polished. The polishing capacity recovering member 18 typically comprises a nylon brush, a metal brush or diamond pellets.

Figure 9:
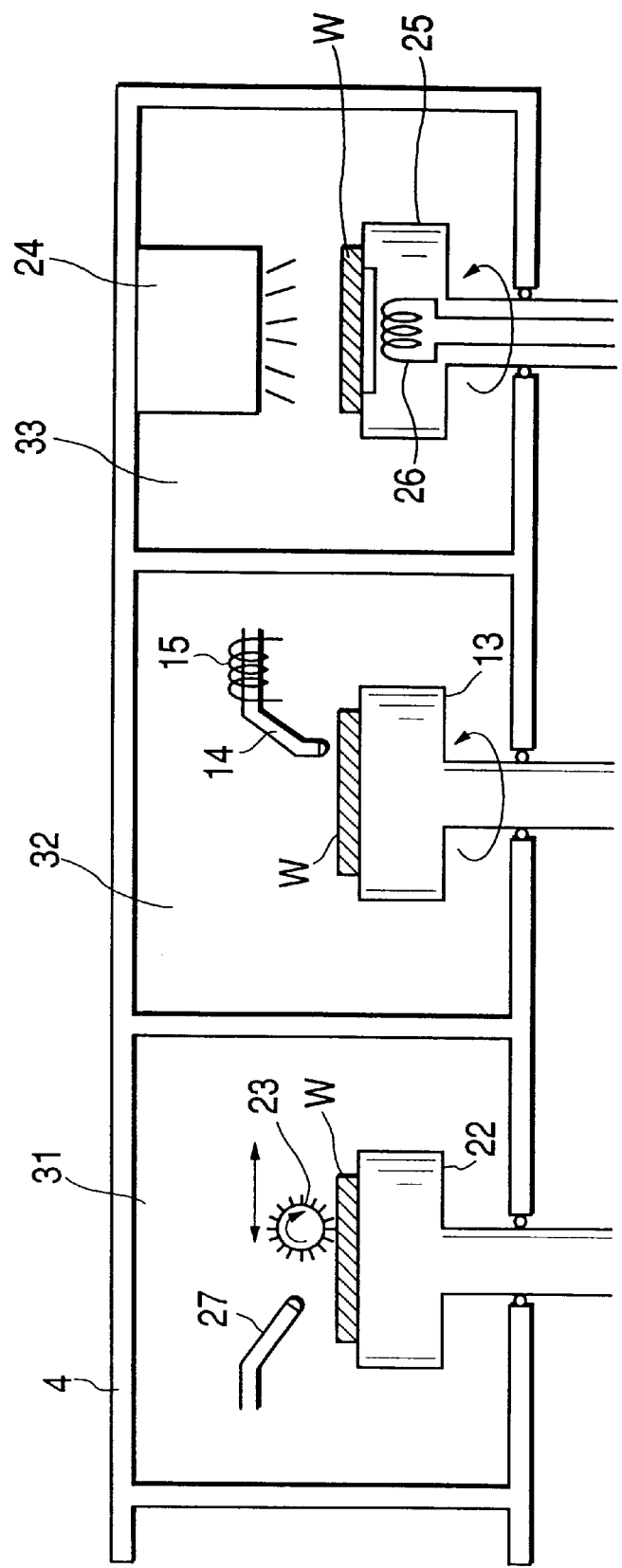
FIG. 9 is a schematic illustration of a cleaning unit that can be used for a polishing apparatus according to the invention.

After the polish, the wafer W is removed from the holder 7 by means of the movable arm 20 and placed on another holder located in the first cleaning chamber 31. Referring now to FIG. 9, the first cleaning chamber 31 is isolated by partition walls 4 and contains therein a holder 22 and a nylon brush 23 as physical cleaning member. The wafer W is placed on the holder 22 with the surface to be polished facing upward and cleansed by the brush 23 as the latter is revolved and moved on the surface of the wafer W to remove polishing particles from the wafer W. At the same time, pure water is supplied from a nozzle 27. The physical cleaning member may be a brush or a sponge made of polyvinylalcohol instead of a nylon brush.

The wafer W cleansed in the cleaning chamber 31 is then taken out by the arm 20 and placed on still another holder 13 arranged in the next cleaning chamber 32. This cleaning chamber 32 has a configuration substantially same as the cleaning unit 3 of FIG. 1 and cleansing liquid of hot pure water heated to or above 80° C. by a heat generating member 15 is sprayed from a nozzle 14 onto the wafer W that is revolving. Ultrasonic waves with a frequency between 0.8 MHz and 10 MHz, which are also called as megasonic waves, may be applied to the wafer W in the second cleaning chamber 32.

After the cleansing operation is over in the cleaning chamber 32, the wafer W is moved to the dry chamber 33, which contains a nozzle 24 for blowing hot dry air and a revolvable table 25 provided with a heat generating member 26. Since the wafer W has been cleansed by hot pure water and is hence still hot, the time required for the drying operation may be short. The wafer W that has been subjected to a plurality of cleaning steps and a drying step is then moved out of the apparatus 1 by means of the arm 20 and put back into the cassette.

Note that the waste cleaning water delivery port is not shown in FIG. 9.

Figure 10:
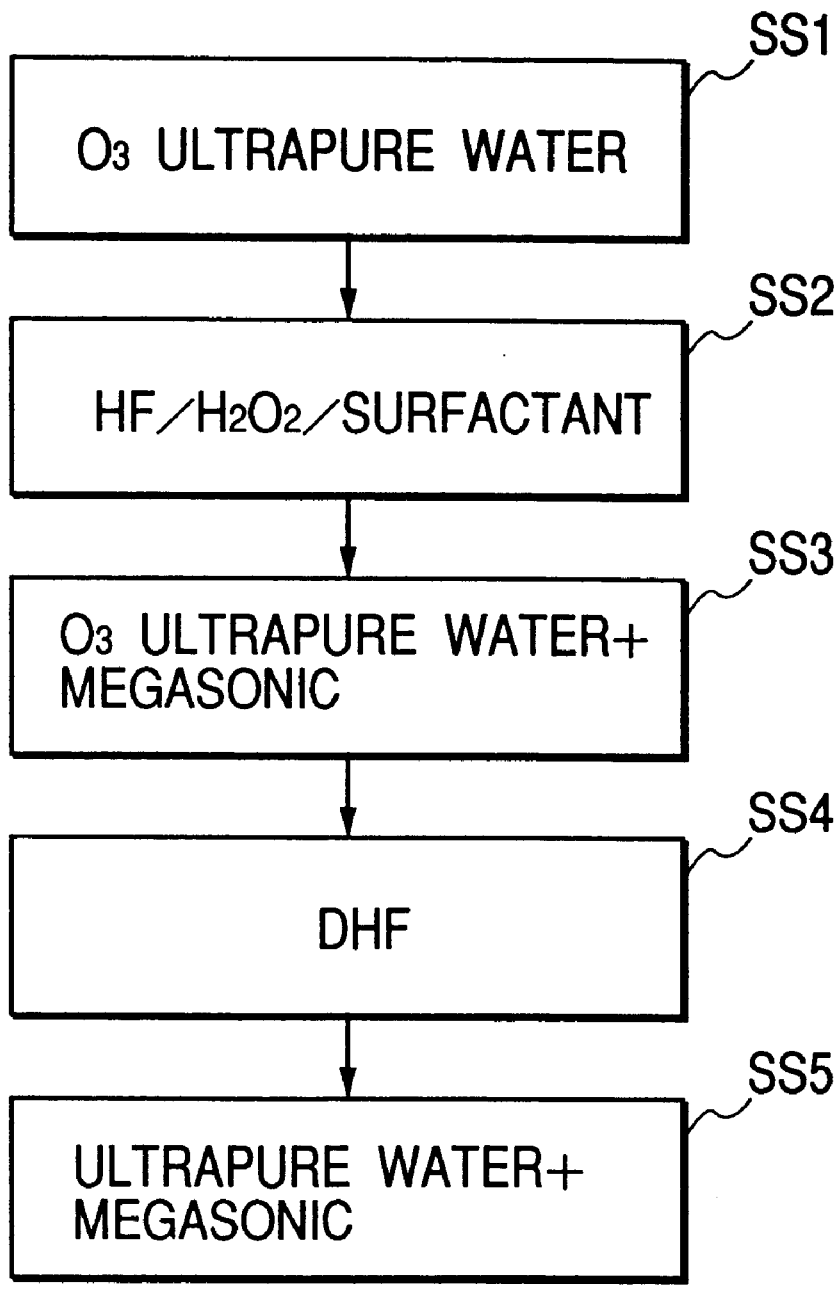
FIG. 10 is a flow chart of the cleaning steps of a cleaning method according to the invention.

Preferably, the wafer is cleaned for another time outside the polishing apparatus in a manner as described below before subjected to an etching or deposition process. The cleaning method to be used for this cleaning process will be described by referring to the flow chart of FIG. 10.

Firstly, the wafer is cleansed with ultrapure water containing ozone by 5 ppm (at room temperature) to remove organic substances and metals adhering to it (Step SS1).

Subsequently, the wafer is cleansed with a cleansing aqueous solution containing HF by 0.5 wt %, $H_2O_2$ by 0.1 to 1.0 wt % and a trace of surfactant at room temperature, applying ultrasonic waves with a frequency of 0.95 MHz, to remove natural oxide film, particles and metals on the surface (Step SS2).

Thereafter, the wafer is cleansed with ozone-containing ultrapure water at room temperature, applying ultrasonic waves of 0.95 MHz (Step SS3).

Then, the wafer is cleansed with 0.1 wt % dilute hydrofluoric acid (DHF) at room temperature in order to remove further the natural oxide film and effect termination of the surface of the silicon wafer (Step SS4).

Finally, the wafer is immersed in hot ultrapure water (HPW), applying ultrasonic waves of 0.95 MHz, to cleanse the wafer (Step SS5). Ultrapure water may be heated above 80° C. for this step.

Figure 11:
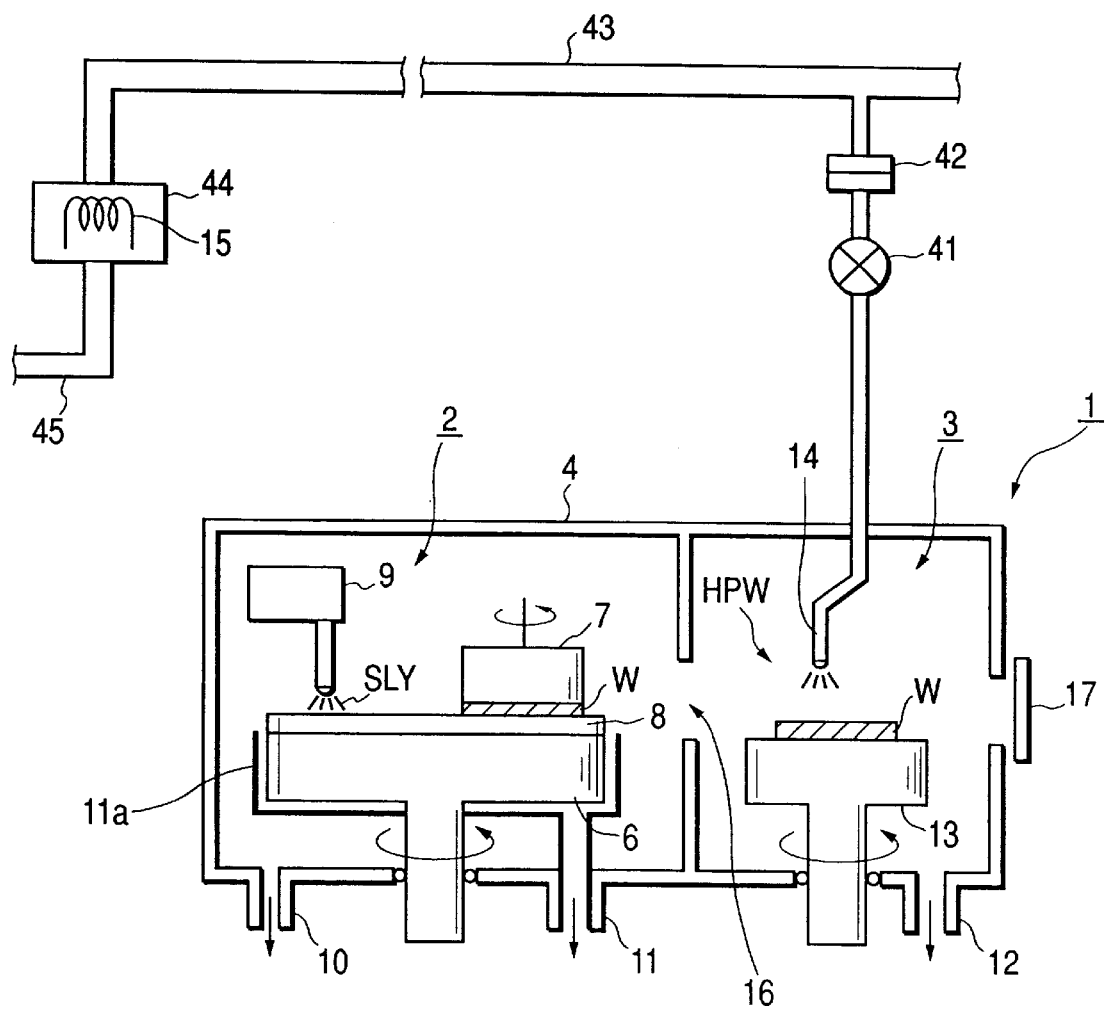
FIG. 11 is a schematic illustration of still another embodiment of polishing apparatus according to the invention.

FIG. 11 is a schematic illustration of still another embodiment of polishing apparatus according to the invention.

In FIG. 11, the components same as those of the apparatus of FIG. 1 are denoted respectively by the same reference symbols.

With the apparatus of FIG. 11, hot pure water is prepared outside the apparatus 1.

Reference numeral 44 denotes a calorifier provided for the plant where the polishing apparatus 1 is installed or in a clean room within the plant, where hot pure water above 80° C. is produced by means of a heater 15.

A water tank for storing pure water is arranged upstream relative to the feed pipe 45.

Hot pure water is fed to the polishing apparatus 1 by way of a hot pure water feed pipe 43 located outside the polishing apparatus. This arrangement is effective particularly when a plurality of polishing apparatus are installed within the plant or the clean room for the polishing/cleaning process.

Reference numerals 41 and 42 denote respectively a valve and a joint.

A hot pure water supply system 43, 44 and 45 illustrated in FIG. 11 may be used with an apparatus as shown in FIGS. 8 and 9.

Steam may be used in place of hot pure water with any of the above described embodiments of polishing apparatus according to the invention.

More specifically, a polished object may be placed above the surface of the water stored in a water vessel and heated to 80 to 100° C. as cleaning means in order to cleanse the surface of the polished object with steam. Alternatively, steam heated to or above 80° C. may be sprayed onto the surface of the polished object as cleaning means through a nozzle.

Steam as used for the purpose of the invention is defined to include gaseous $H_2O$ and $H_2O$ mist between 80° C. and 100° C.

Now, a method of manufacturing a multilayer wired section for a semiconductor device or some other devices according to the invention will be described by referring to FIGS. 12A through 12G.

Figure 12A:
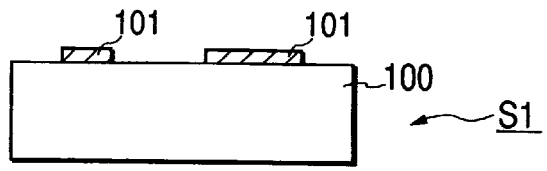
FIGS. 12A, 12B, 12C, 12D, 12E, 12F and 12G are schematic cross sectional side views of a device having a wiring section according to the invention, illustrating different manufacturing steps.

A lower wired layer 101 of polycrystalline silicon or silicide is formed to a thickness between 0.5 and 1.5 microns on a silicon wafer 100 to be polished (Step S1, FIG. 12A).

Figure 12B:
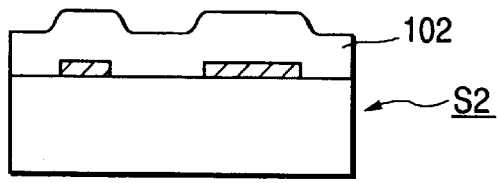
Figure 12C:
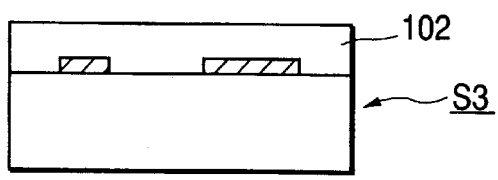
Figure 12D:
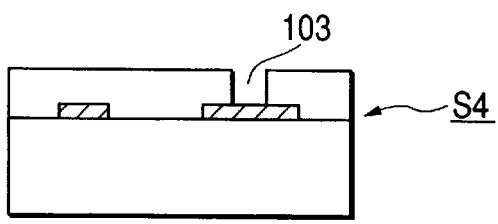
Figure 12E:
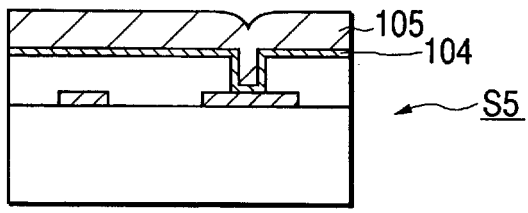

A silicon oxide film 102 having a nonstoichiometric compositional ratio is formed to a thickness between 1.5 and 2.5 microns by a plasma CVD technique, using tetraethoxysilane (TEOS), on the silicon wafer 100 having the lower wired layer 101 (Step S2, FIG. 12B).

Then, the silicon oxide film is polished by about 500 nm to 1.2 $\mu$m by means of a polishing apparatus as shown in FIGS. 8 and 9, a polishing agent prepared by dispersing fine particles of silica with a particle diameter between 30 and 250 microns into a KOH-containing aqueous solution and a polyurethane polishing pad. Thereafter, the polished surface is cleaned by means of a brush and pure water fed to it within the polishing apparatus. Subsequently, the wafer is driven to rotate and subjected to a spin cleaning operation by applying ultra pure water heated to 80° C. and imparted with ultrasonic vibration with a frequency of 0.95 MHz to the polished surface. Then, the wafer is dried in a drying chamber before moved out of the polishing apparatus (Step S3, FIG. 12C).

Thereafter, hexamethyldisilazane (HMDS) is applied to the wafer and subsequently photoresist is applied thereto to a film thickness between 1.0 and 1.3 microns. Then, the wafer is baked. The baked wafer is then put into an aligner and exposed to a beam of KrF excimer laser to form a latent image of a pattern to be used for producing a large number of contact holes. The wafer is removed from the aligner and the latent image of the photoresist is developed. Subsequently, the wafer is put into a reactive ion etching system in order to anisotropically etch the exposed silicon oxide and produce patterned contact holes, using the developed photoresist pattern as mask. Then, the photoresist on the wafer is removed (Step S4, FIG. 12D).

Then, the wafer having contact holes is cleaned by way of five cleaning steps.

The wafer stripped of the resist is cleansed with ultra pure water (room temperature) containing ozone to a concentration of 5 ppm in order to remove the adherend consisting of organic substances and metals. Subsequently, the wafer is cleansed with a cleansing aqueous solution containing HF by 0.5 wt %, $H_2O_2$ by 0.1 to 1.0 wt % and a trace of surfactant at room temperature, applying ultrasonic waves with a frequency of 0.95 MHz, to remove natural oxide film, particles and metals on the surface. Thereafter, the wafer is cleansed with ozone-containing ultrapure water at room temperature, applying ultrasonic waves of 0.95 MHz. Then, the wafer is cleansed with 0.1 wt % dilute hydrofluoric acid (DHF) at room temperature in order to remove further the natural oxide film and effect termination of the surface of the silicon wafer. Finally, the wafer is immersed in hot ultrapure water (HPW) at 80° C., applying ultrasonic waves of 0.95 MHz, to cleanse the wafer.

Thereafter, the wafer is subjected to a plasma cleaning process in a plasma cleaning chamber of a cluster type multi-chamber system. Then a Ti/TiN barrier layer 104 (laminate of a Ti layer and a TiN layer) is formed to a thickness of 20 to 60 nm in the sputtering chamber and an aluminum film 105 containing or not containing copper is formed on the Ti/TiN barrier layer 104 in the aluminum chamber. Subsequently, a reflow operation is conducted at 400 to 500° C. (Step S5, FIG. 12E).

Figure 12F:
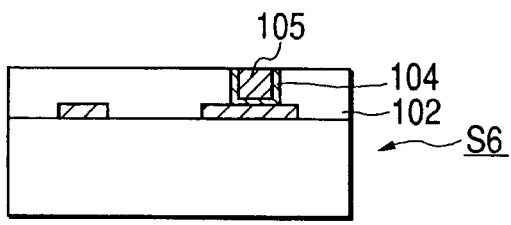
Figure 12G:
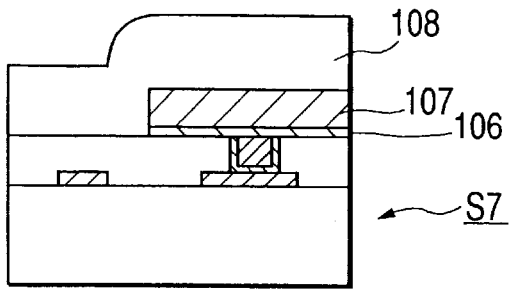

Then, the barrier layer 104 and the aluminum film 105 on the silicon oxide film 102 are removed by means of CMP, using a slurry obtained by dispersing fine particles of silica into water or solutions, to which ammonium iron sulfate is added by 0.01 to 0.5 mol/liter, until the barrier layer 104 and the aluminum film 105 are left only in the contact holes (Step S6, FIG. 12F). After cleansing the surface, a TiN layer 106 is formed to a thickness of 20 to 60 nm by sputtering and then an aluminum silicon film 107 is formed to a thickness of 1 to 2 microns also by sputtering, which films are then etched to produce a wiring pattern. Then, silicon oxide film 108 is formed to a thickness of about 2 microns by plasma CVD. The silicon oxide film shows undulations to reflect the wiring pattern (Step S7, FIG. 12G). The above steps will be repeated when a multiple of wiring layers are to be produced.

Now, another method of manufacturing a multilayer wired section for a semiconductor device or some other devices according to the invention will be described by referring to FIGS. 13A through 13G.

Figure 13A:
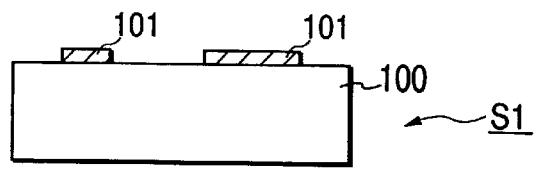
FIGS. 13A, 13B, 13C, 13D, 13E, 13F and 13G are schematic cross sectional side views of another device having a wired section according to the invention, illustrating different manufacturing steps.

A lower wired layer 101 of polycrystalline silicon or silicide is formed to a thickness between 0.5 and 1.5 microns on a silicon wafer 100 to be polished (Step S1, FIG. 13A).

Figure 13B:
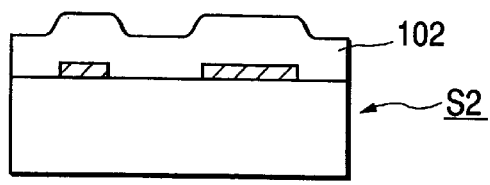
Figure 13C:
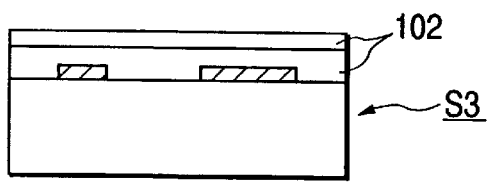
Figure 13D:
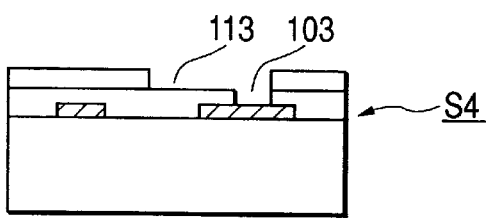
Figure 13E:
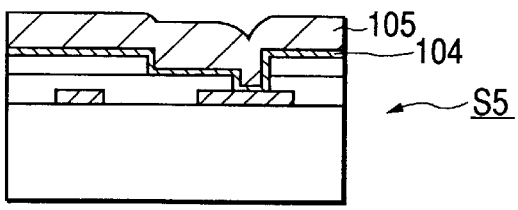

A silicon oxide film 102 having a nonstoichiometric compositional ratio is formed by a plasma CVD technique or some other techniques, using tetraethoxysilane (TEOS), on the silicon wafer 100 having the lower wired layer 101 (Step S2, FIG. 13B).

Then, the silicon oxide film is polished by about 500 nm to 1.2 $\mu$m by means of a polishing apparatus as shown in FIGS. 8 and 9, a polishing agent prepared by dispersing fine particles of silica with a particle diameter between 30 and 250 microns into a KOH-containing aqueous solution and a polyurethane polishing pad. Thereafter, the polished surface is cleaned by means of a brush and pure water fed to it within the polishing apparatus. Subsequently, the wafer is driven to rotate and subjected to a spin cleaning operation by applying ultra pure water heated to 80° C. and imparted with ultrasonic vibration with a frequency of 0.95 MHz to the polished surface. Then, the wafer is dried in a drying chamber before moved out of the polishing apparatus. A silicon nitride film is formed by plasma CVD and subsequently a silicon oxide film 102 is formed once again by plasma CVD (Step S3, FIG. 13C).

Thereafter, hexamethyldisilazane (HMDS) is applied to the wafer and subsequently photoresist is applied thereto to a film thickness between 1.0 and 1.3 microns. Then, the wafer is baked. The baked wafer is then put into an aligner and exposed to light to form a latent image of a pattern to be used for producing a wiring groove 113. The wafer is removed from the aligner and the latent image of the photoresist is developed. Subsequently, the wafer is put into a reactive ion etching system in order to anisotropically etch the exposed silicon oxide until the silicon nitride film becomes exposed and produce a wiring groove 113, using the developed photoresist pattern as mask.

Then, once again, hexamethyldisilazane (HMDS) is applied to the wafer and subsequently photoresist is applied thereto to a film thickness between 1.0 and 1.3 microns. Then, the wafer is baked. The baked wafer is then put into an aligner and exposed to light to form a latent image of a pattern to be used for producing a contact hole. The wafer is removed from the aligner and the latent image of the photoresist is developed. Subsequently, the wafer is put into a reactive ion etching system in order to anisotropically etch the silicon nitride film and the exposed silicon oxide and produce a patterned contact hole, using the developed photoresist pattern as mask (Step S4, FIG. 13D). The etch selectivity ratio of silicon oxide and silicon nitride can be modified by modifying, for example, the ratio of the flow rate of $CF_4$ to that of $CHF_3$.

Then, the wafer having contact holes is cleaned by way of five cleaning steps.

The wafer stripped of the resist is cleansed with ultra pure water (room temperature) containing ozone to a concentration of 5 ppm in order to remove the adherend consisting of organic substances and metals.

Subsequently, the wafer is cleansed with a cleansing aqueous solution containing HF by 0.5 wt %, $H_2O_2$ by 0.1 to 1.0 wt % and a trace of surfactant at room temperature, applying ultrasonic waves with a frequency of 0.95 MHz, to remove natural oxide film, particles and metals on the surface. Thereafter, the wafer is cleansed with ozone-containing ultrapure water at room temperature, applying ultrasonic waves of 0.95 MHz. Then, the wafer is cleansed with 0.1 wt % dilute hydrofluoric acid (DHF) at room temperature in order to remove further natural oxide film and effect termination of the surface of the silicon wafer. Finally, the wafer is immersed in hot ultrapure water (HPW) at 80° C., applying ultrasonic waves of 0.95 MHz, to cleanse the wafer.

Thereafter, the wafer is subjected to a plasma cleaning process in the plasma cleaning chamber of a cluster type multi-chamber system. Then a Ti/TiN barrier layer 104 (laminate of a Ti layer and a TiN layer) is formed to a thickness of 20 to 60 nm in the sputtering chamber and an aluminum film 105 containing or not containing copper is formed on the Ti/TiN barrier layer 104 in the aluminum sputtering chamber. Subsequently, a reflow operation is conducted at 400 to 500° C. (Step S5, FIG. 13E). In place of the aluminum film, a copper film or a metal film containing copper as principal ingredient may be formed by CVD, sputtering or plating.

Figure 13F:
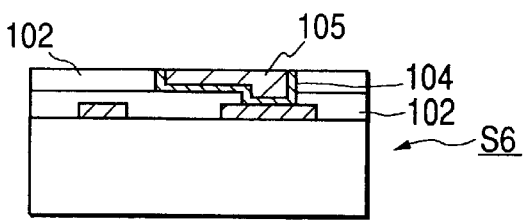
Figure 13G:
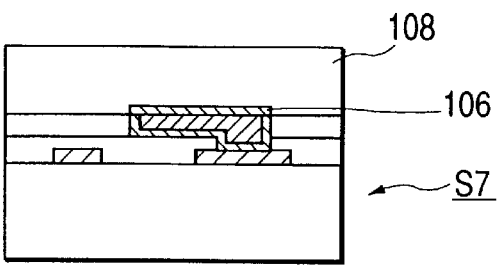
Figure 14A:
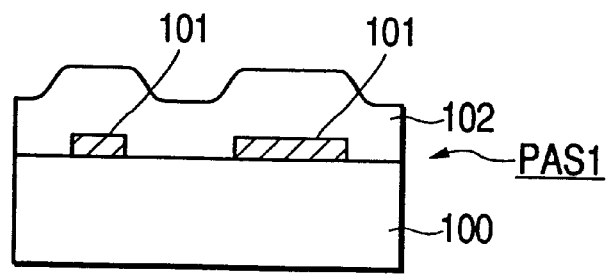
FIGS. 14A, 14B, 14C and 14D of the accompanying drawings are schematic cross sectional side views of a known semiconductor device, illustrating different manufacturing steps.
Figure 14B:
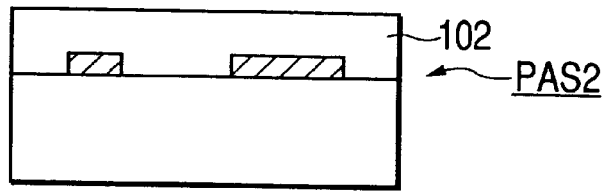
Figure 14C:
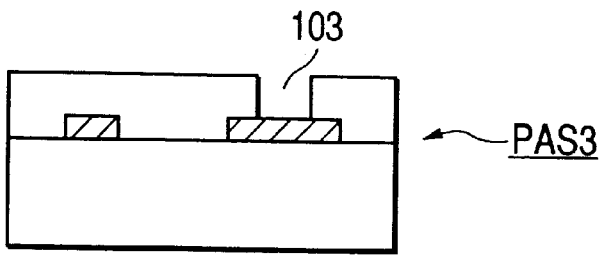
Figure 14D:
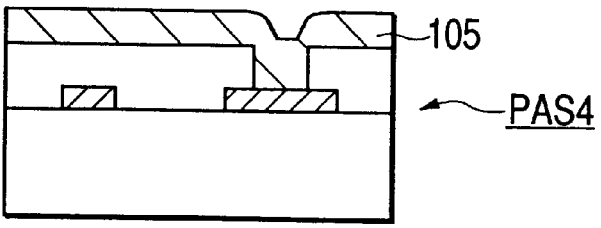

Then, the barrier layer 104 and the aluminum film 105 on the silicon oxide film 102 are removed by means of CMP, using a slurry obtained by dispersing fine particles of silica into water, to which potassium acetate is added, until the barrier layer 104 and the aluminum film 105 are left only in the groove 113 and the contact holes (Step S6, FIG. 13F). Subsequently, the wafer is cleaned by means of brush and hot pure water to remove fine particles of silica and potassium. After cleansing the surface, a TiN layer 106 is formed to a thickness of 20 to 60 nm by sputtering and then heat treated. Thereafter, the film is etched to produce a wiring pattern. Then, silicon oxide film 108 is formed to a thickness of about 2 microns by plasma CVD (Step S7, FIG. 13G). Steps S2 through S7 will be repeated when a multiple of wiring layers are to be produced.

Now, the invention will be further described by way of an example, although the present invention is not limited to the example, which may be modified appropriately without departing from the scope of the invention.

A total of four monocrystal silicon wafers were prepared and a silicon oxide film having a nonstoichiometric compositional ratio is formed by a plasma CVD technique, using TEOS, on each of the wafers.

The four wafers carrying thereon a silicon oxide film were then put into a chemical mechanical polishing apparatus according to the invention and the silicon oxide film was polished and thinned by using a polishing solution prepared by dispersing fine particles of silica into an aqueous solution of KOH and a polyurethane polishing pad. One of the specimens was washed with ultrapure water at room temperature and thereafter the extent of potassium (K) adhesion on the wafer was observed to find it to be $8\times10^{12}$ atm/cm$^2$.

Another one of the specimens carrying thereon a polished silicon oxide film and adherent potassium (K) was dipped into ultrapure water held to 80° C. in a thermostated tank, which was annexed to the polishing apparatus, for 10 minutes without drying it.

After taking out the wafer from the thermostated tank and drying it, the extent of K adhesion on the wafer was observed to find it to be less than the measurable limit. Thus, no K adhesion to the silicon oxide film was observed on the surface of the wafer.

Still another one of the specimens also carrying thereon a polished silicon oxide film and adherent potassium (K) was subjected to a spin cleansing operation without drying it by using a spin cleaning apparatus as shown in FIG. 9 and annexed to the polishing apparatus and ultrapure water held to 80° C.

After drying the wafer, the extent of K adhesion on the wafer was observed to find it to be less than the measurable limit. Thus, no K adhesion to the silicon oxide film was observed on the surface of the wafer.

The last specimen also carrying thereon a polished silicon oxide film was once dried and then subjected to a spin cleaning operation, using hot pure water. When observed, both K and fine particles of silica were found adhering to the surface of the specimen, although the extent of K adhesion to be far below $8\times10^{12}$ atm/cm$^2$.

Thus, according to the invention, potassium and other alkali metals adhering to the interlayer insulation film of a polished object, which may be a semiconductor device or an electrooptical device, can be removed to a permissible level so that problems such as short-circuiting and corrosion of the multilayer wired section of the device that can be caused by adhering K can be prevented from occurring.

A cleaning method according to the invention is simple and does not involve the use of a chemical solution containing chemicals such as sulfuric acid and/or nitric acid to a high concentration level so that a cleaning unit can be arranged integrally with a polishing unit without any risk of corroding the components of the polishing unit by a chemical solution.

Additionally, since the polished object is moved in a highly wet atmosphere in the apparatus that is enclosed by partition walls without drying and cleansed with hot pure water, fine particles of the polishing agent and debris scraped off from the polished object can also be removed without problem along with potassium.

What is claimed is:

1. A polishing unit for polishing an object to produce a polished object by means of a polishing agent containing potassium, a cleaning unit for cleaning the polished object, and a transfer arm for moving the polished object from said polishing unit into said cleaning unit, and isolating means for isolating an internal atmosphere of said polishing unit, said cleaning unit and said transfer arm from an external atmosphere, wherein:

said polishing unit has means for supplying the polishing agent containing potassium;

said cleaning unit has means for bringing hot pure water or steam of pure water heated to or above 80° C. into contact with the polished object; and said transfer arm is operable to move the polished object without drying the polished object.

2. A polishing apparatus according to claim 1, wherein the cleaning unit additionally has means for drying the polished object after cleaning it with hot pure water.

3. A polishing apparatus according to claim 2, wherein the polishing unit and the cleaning unit are provided with an exhaust port and have means for maintaining the internal atmosphere under negative pressure relative to the external atmosphere.

4. A polishing apparatus according to claim 1, wherein the cleaning means of the cleaning unit has a heating means adapted to heat pure water to or above 80° C.

5. A polishing apparatus according to claim 1, wherein the cleaning unit has means for applying ultrasonic waves with a frequency between 0.8 MHz and 10 MHz to the hot pure water used by the cleaning means.

6. A polishing apparatus according to claim 1, wherein said means for bringing the hot pure water is operable to bring hot pure water that contains ozone.

7. A polishing apparatus according to claim 1, wherein the cleaning unit has a cleaning member adapted to be brought into contact with the polished object to physically remove any foreign objects adhering to it.

8. A polishing apparatus according to claim 1, wherein the hot pure water is supplied from outside of said polishing apparatus.

9. A polishing apparatus according to claim 1, wherein said means for bringing hot pure water is structured to cooperate with a piping system of a plant in which said polishing apparatus is installed.

* * * * *

UNITED STATES PATENT AND TRADEMARK OFFICE
CERTIFICATE OF CORRECTION

PATENT NO. : 6,332,835 B1  
DATED : December 25, 2001  
INVENTOR(S) : Nishimura, Matsuomi et al.

Page 1 of 1

It is certified that error appears in the above-identified patent and that said Letters Patent is hereby corrected as shown below:

Column 3,  
Line 44, "method" should read -- a method --.

Column 7,  
Line 24, "vessels" should read -- vessels of --;  
Line 50, "includes" should read -- include --; and  
Line 67, "phosphor" should read -- phosphorus --.

Column 8,  
Line 56, "as" should be deleted.

Column 9,  
Line 7, "before" should read -- before being --.

Signed and Sealed this

Thirtieth Day of April, 2002

*Attest:*

*Attesting Officer*

JAMES E. ROGAN  
*Director of the United States Patent and Trademark Office*